United States Patent
He et al.

[11] Patent Number: 5,909,108
[45] Date of Patent: Jun. 1, 1999

[54] CURRENT-SHARING CIRCUIT FOR PARALLEL-COUPLED SWITCHES AND SWITCH-MODE POWER CONVERTER EMPLOYING THE SAME

[75] Inventors: Jin He, Plano; Mark E. Jacobs, Dallas, both of Tex.

[73] Assignee: Lucent Technologies Inc., Murray Hill, N.J.

[21] Appl. No.: 09/027,579

[22] Filed: Feb. 23, 1998

[51] Int. Cl.$^6$ .................................................. G05F 1/613
[52] U.S. Cl. ......................... 323/225; 323/222; 323/907
[58] Field of Search ................................... 323/222, 225, 323/271, 272, 282, 283, 284, 285, 299, 907

[56] References Cited

U.S. PATENT DOCUMENTS

| | | | |
|---|---|---|---|
| 5,642,027 | 6/1997 | Windes et al. .......................... | 323/283 X |
| 5,723,956 | 3/1998 | King et al. ............................ | 323/282 X |
| 5,729,119 | 3/1998 | Barbour ................................. | 323/222 |

OTHER PUBLICATIONS

"New 3rd–Generation FUJI IGBT MODULES N series Application Manual," Chapter 2, pp. 2–2—2–8 and 8–2—8–4. No date.

S. Clemente, A. Dubhashi and B. Pelly, "IGBT Characteristics," pp. E–3—E–14. No date.

Steve Clemente, "Application Characterization of IGBTs," pp. E–15—E–32. No date.

*Primary Examiner*—Peter S. Wong
*Assistant Examiner*—Y. J. Han

[57] ABSTRACT

For use in a switch-mode power converter including parallel-coupled first and second switches, the first switch having a temperature-dependent resistance, a circuit for, and method of, distributing current between the first and second switches. In one embodiment, the circuit includes a device having a temperature-dependent characteristic, in thermal communication with the first switch and electrically coupled to a gate of the first switch, that senses a temperature of the first switch, modulates an amplitude of a drive waveform applied to the gate based on the temperature and thereby redistributes the current.

26 Claims, 3 Drawing Sheets

CURRENT-SHARING CIRCUIT FOR PARALLEL-COUPLED SWITCHES AND SWITCH-MODE POWER CONVERTER EMPLOYING THE SAME

TECHNICAL FIELD OF THE INVENTION

The present invention is directed, in general, to power conversion and, more specifically, to a current-sharing circuit for parallel-coupled switches, a method of operating such circuit and a switch-mode power converter employing the circuit or the method.

BACKGROUND OF THE INVENTION

Switch-mode power converters are widely used in various power conversion applications, such as single-phase and three-phase power factor corrected AC/DC rectifiers and DC/AC inverters. As the power levels of the converters are increased, multiple fast switching parallel-coupled semiconductor power switching devices are employed to accomplish system application requirements. In some cases, the power switching devices form main boost switches for a boost converter, which are simultaneously turned on and off.

Insulated-gate bipolar transistors (IGBTs) have much lower conduction losses as compared with field-effect transistors (FETs) and much faster switching capabilities and easier gate drive control when compared to bipolar junction transistors (BJTs) and gate turnoff thyristors (GTOs). The IGBT, with its faster switching speed and lower conduction losses, has become a preferred semiconductor switching device for use in high frequency and high power applications.

Unfortunately, the minority carrier switching devices, such as the IGBTs, do not share current well, especially when two or more IGBTs are parallel-coupled. The current-sharing capability of the switching devices is important for high frequency and high power applications where multiple power switching devices are coupled in parallel to handle the required current. The parallel-coupled IGBT switching devices do not share current well primarily because of the conduction characteristics of the mismatched devices and the negative temperature coefficient of the on-state resistances. The IGBT with the better conduction characteristics, i.e., lower voltage drop, carries a larger share of the load current to equalize its voltage drop with the other IGBT. This is the case even when the switching devices are mounted on a common heat sink. Experience and tests have indicated that the current unbalance between parallel-coupled IGBTs may be as high as 50 to 70%, at low currents. The poor current sharing of the switching devices significantly reduces the device silicon utilization due to the current imbalance and the device carrying more current will have a higher body temperature.

To overcome the poor current-sharing capabilities of the parallel-coupled IGBTs, more semiconductor devices are normally used to increase the device current margin. Unfortunately, increasing the number of devices also increases the likelihood of mismatching each device characteristics thereby increasing the complexity of printed wiring board (PWB) circuit layout and the overall cost. As a result of the unpredictable current-sharing capabilities of the parallel-coupled IGBTs, the overall system cost is increased and the reliability substantially reduced.

Accordingly, what is needed in the art is an improved method that provides balanced current distribution for parallel-coupled semiconductor power switches.

SUMMARY OF THE INVENTION

To address the above-discussed deficiencies of the prior art, the present invention provides, for use in a switch-mode power converter including parallel-coupled first and second switches, the first switch having a temperature-dependent resistance, a circuit for, and method of, distributing current between the first and second switches. In one embodiment, the circuit includes a device having a temperature-dependent characteristic, in thermal communication with the first switch and electrically coupled to a gate of the first switch, that senses a temperature of the first switch, modulates an amplitude of a drive waveform applied to the gate based on the temperature and thereby redistributes the current.

The present invention therefore introduces a gate voltage modulation current distribution scheme. By thermally coupling a temperature sensitive device to a switch that has temperature dependent characteristics and adjusting the gate control voltage amplitude of the switch based on a thermal characteristic of the switch, parallel-coupled switches can be made to share current, e.g., substantially equally.

In one embodiment of the present invention, the first switch is an insulated gate bipolar transistor (IGBT). Those skilled in the art will understand, however, that other devices with metal-oxide-semiconductor (MOS) gates and negative "ON" resistance-temperature characteristics may also be advantageously employed.

In one embodiment of the present invention, the device is a positive temperature coefficient (PTC) resistor and is further coupled to an output of a gate driver of the switch-mode power converter. Alternatively, the device can be a negative temperature coefficient (NTC) resistor and further coupled to ground. The PTC, or alteratively NTC, resistor is thermally coupled to the switch and is used to modulate the switch's gate control voltage.

In one embodiment of the present invention, the switch-mode power converter further includes a pulse width modulation (PWM) controller. Those skilled in the art are familiar with PWM control and should appreciate that other modulation control schemes fall within the broad scope of the present invention.

In one embodiment of the present invention, the switch-mode power converter further includes an adjustable output voltage regulator, or alternatively an output level adjustable step-down DC/DC converter, that provides a voltage supply source to the gate driver. Those skilled in the art are familiar with other variable voltage supply topologies that are also within the broad scope of the present invention.

In one embodiment of the present invention, the device is integrated with the first switch into a single component. Of course, the broad scope of the present invention is not limited to a particular use of integrated or discrete components.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
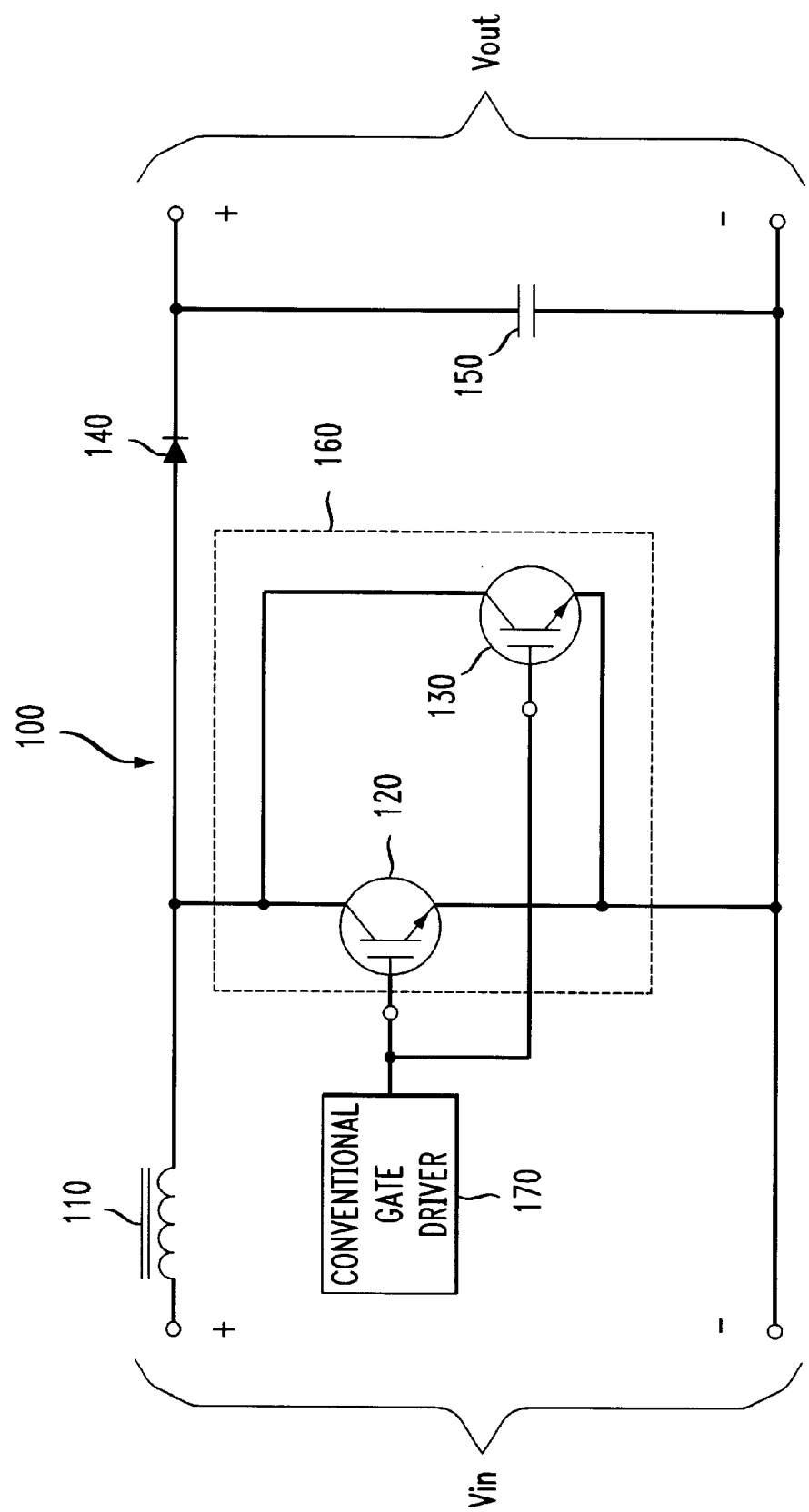
FIG. 1 illustrates a schematic diagram of a conventional switch-mode power converter employing multiple parallel-coupled switches.

Referring initially to FIG. 1, illustrated is a schematic diagram of a conventional switch-mode power converter 100 employing multiple parallel-coupled switches 160. The power converter 100 (a boost converter topology is illustrated) includes a boost inductor 110 that is coupled to the parallel-coupled switches 160 and a boost diode 140. The parallel-coupled switches 160 comprise first and second boost switches 120, 130, which cooperate to perform the function of a single (larger) boost switch. Also shown is an output capacitor 150 that is coupled to the boost diode 140 and the first and second boost switches 120, 130. The first and second boost switches 120, 130 are also coupled to a conventional gate driver 170 that provides a control voltage to control the turn-on and turn-off characteristics of the first and second boost switches 120, 130. In the illustrated embodiment, the first and second boost switches 120, 130 are IGBTs having the inherent current-sharing difficulties described previously.

More particularly, a primary factor that inhibits current-sharing between the parallel-coupled first and second boost switches 120, 130 are the devices' conduction characteristics, namely, the collector-to-emitter saturation voltage, i.e., $V_{ce}(sat)$. Tests have indicated that a 0.1V–0.2V mismatch of the collector-to-emitter saturation voltage $V_{ce}$ (sat) for two IGBTs, mounted on a common heat sink, may lead to a 9° C. to 15° C. case temperature difference at 50° C. ambient. Since the first and second boost switches 120, 130 are parallel-coupled, the voltage drops across the switches are the same. The switch with better conduction characteristics, as a result, will carry a larger share of the load current to equalize its voltage drop with the other switch. Consequently, its power dissipation and junction temperature are higher by an amount that depends on the thermal design of the switches, e.g., the thermal coupling between the switches.

While the first and second boost switches 120, 130 are ON, i.e., conducting, the collector-to-emitter saturation voltage $V_{ce}(sat)$ of the first and second boost switches 120, 130 change in accordance with that particular device's collector current ($I_c$), gate voltage ($V_{ge}$) and the junction temperature ($T_j$). The collector-to-emitter saturation voltage $V_{ce}(sat)$ increases in direct proportion to the collector current and in inverse proportion to the gate voltage value. As a result of the above-described relationship, the device collector-to-emitter saturation voltage $V_{ce}(sat)$ can be varied by controlling the gate voltage. It should be noted that care should be taken to maintain a minimum gate voltage, i.e., $V_{ge}=V_{ge, min}+\Delta V$, so that the device's conduction loss is within the thermal design limit. In most cases, however, the switching power losses are the dominant power loss of all losses for the switching device. For a better understanding of IGBT characteristics and their application, see "IGBT Characteristics" by S. Clemente, et al., International Rectifier Application Notes, AN-983A, pages E-3 to E-14; "Application Characterization of IGBTs" by S. Clemente, et al., International Rectifier Application Notes, AN-990, pages E-15 to E-32; and Chapter 2 "Technical Terms & Characteristics," pages 2-2 to 2-8 and Chapter 8 "Parallel Connections," pages 8-2 to 8-4 of FUJI ELECTRIC "New 3rd-Generation Fuji IGBT Modules N series Application Manual," which are incorporated herein by reference.

The present invention recognizes that a very small variation of collector-to-emitter saturation voltage $V_{ce}(sat)$ between parallel-coupled switches may result in a large current unbalance between the parallel-coupled switches. Also, a small reduction of the gate voltage $V_{ge}$ on the switch carrying the larger share of load current will correspondingly increase the device's collector-to-emitter saturation voltage $V_{ce}(sat)$. The increased collector-to-emitter saturation voltage $V_{ce}(sat)$, will in turn, reduce the current through the device forcing the other parallel-coupled switch(es) to handle a larger portion of the load current. The present invention exploits the aforementioned relationships to provide a method that distributes the load current between multiple parallel-coupled switches to, in many cases, equally share the load current between the switches. The present invention will be explained in greater detail with respect to FIG. 2.

Figure 2:
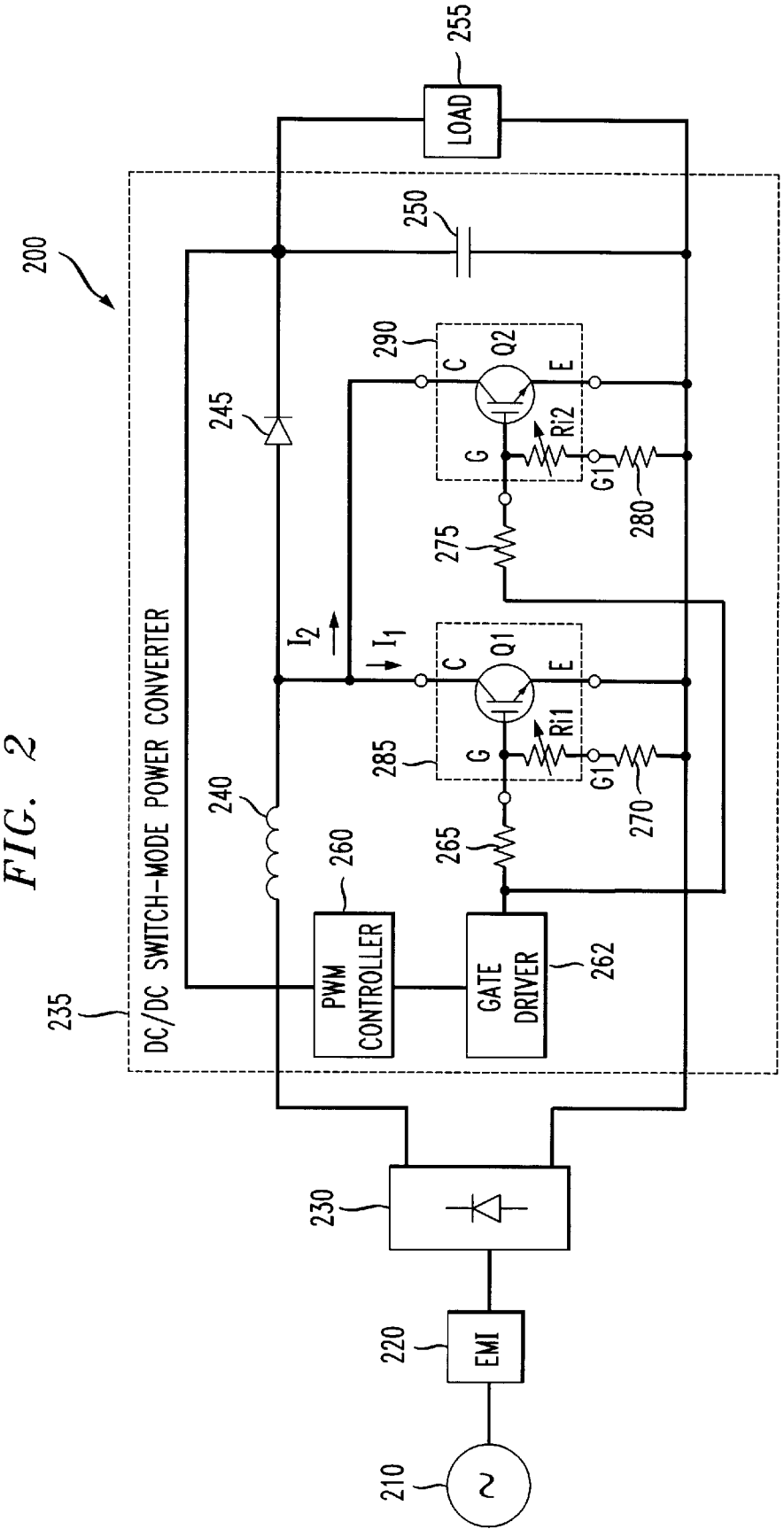
FIG. 2 illustrates a schematic diagram of an embodiment of a power supply employing a DC/DC switch-mode power converter constructed using the principles of the present invention.

Turning now to FIG. 2, illustrated is a schematic diagram of an embodiment of a power supply 200 employing a DC/DC switch-mode power converter 235 constructed using the principles of the present invention. The power supply 200 includes an AC input power source 210, such as a commercial utility, typically providing a single or three phase AC supply voltage. The AC power source 210 is coupled to an electromagnetic interference (EMI) filter 220 that filters the input AC power prior to providing it to a bridge rectifier 230. The rectifier 230 converts the AC input power to an unregulated DC supply voltage for the DC/DC switch-mode power converter 235, which in turn, is coupled to an electrical load 255, such as a DC/AC inverter for motor drives or another DC/DC converter with isolation for telecommunication applications.

In the illustrated embodiment, the switch-mode power converter 235 employs a boost converter topology, i.e., the power converter's 235 DC output voltage is greater in magnitude than the DC supply voltage from the rectifier 230. Those skilled in the art should readily appreciated that other switch-mode topologies, such as a buck converter, are within the broad scope of the present invention. The power converter 235 includes an inductor 240 that is coupled to a diode 245 and to parallel-coupled first and second switch assemblies 285, 290. The diode 245 is coupled to an output capacitor 250 and to the load 255. Also shown is a pulse-width-modulation (PWM) controller 260 that provides a modulated gate control signal (voltage) to a gate driver 262, which in turn, modulates the amplitude of the gate control voltage. The gate driver 262 is also coupled to the first and second switch assemblies 285, 290 through first and second gate resistors 265, 275, respectively. Third and fourth resistors 270, 280 are also shown coupling the first and second switch assemblies 285, 290, respectively, to ground.

The construction and operation of the first and second switch assemblies 285, 290 will be explained in greater with respect to FIG. 3.

Figure 3:
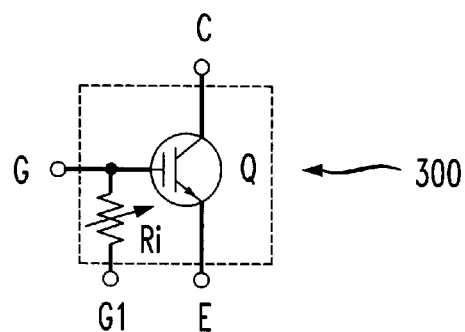
FIG. 3 illustrates a schematic diagram of an embodiment of a switch assembly constructed using the principles disclosed by the present invention.

Turning now to FIG. 3, illustrated is a schematic diagram of an embodiment of a switch assembly 300 constructed using the principles of the present invention. The switch assembly 300 (analogous to the first and second switch assemblies 285, 290 illustrated in FIG. 2) includes a switch Q, with negative "ON" resistance-temperature coefficient characteristics, and a circuit that includes a temperature sensitive device Ri that is thermally coupled to the switch Q; a negative temperature coefficient (NTC) resistor is shown coupled to the gate of switch Q. Alternatively, in another embodiment, the temperature sensitive device Ri is a positive temperature coefficient (PTC) resistor. In an advantageous embodiment, the switch Q is an Insulated Gate Bipolar Transistor (IGBT). It should be apparent to those skilled in the art that other devices with a MOS-gate and negative "ON" resistance-temperature coefficient characteristics may also be advantageously employed as the switch Q.

The temperature sensitive device Ri is integrated into the switch device body, i.e., packaging, of switch Q to sense the switch's body temperature. The resistance of the temperature sensitive device Ri decreases as the switch's temperature increases, keeping in mind that with paralleled-coupled IGBTs, the IGBT conducting more current will have a higher "body" temperature. The switch assembly's thermal feedback mechanism, i.e., resistor Ri, is used to modulate the gate voltage $V_{ge}$ of switch Q.

With continuing reference to FIGS. 2 and 3, the operation of the current sharing mechanism will hereinafter be described in detail. For purposes of the present discussion, assume that switch Q1, in the first switch assembly 285, has a lower collector-to-emitter saturation voltage $V_{ce}$(sat) and therefore carries more load current (Io), i.e., I1>I2 and I2=Io−I1. Consequently, the switch Q1 will have more switching and conduction power losses than switch Q2. The temperature rise of the first switch assembly 285 and the junction temperature $T_j$ of the switch Q1 will also be higher than the second switch assembly 290. Since the NTC gate resistor, i.e., device Ri1, is part of the first switch assembly 285 and thermally coupled to the switch Q1, the gate resistance reduction of the device Ri1 will be higher than its equivalent counterpart device Ri2 in the second switch assembly 290. It should be noted that if a PTC resistor is used for the device Ri1, the circuit configuration will also change, i.e., the device Ri1 will be series-coupled with the first gate resistor 265 and the gate of switch Q1 with the third resistor 270 coupled to the gate of switch Q1.

As discussed previously, the gate voltage $V_{ge}$ of switch Q1 is directly proportional to the value of device Ri1 and is described by the following relationship:

$$V_{ge} = V_s(Ri1+Re)/(Rg+Ri1+Re) \quad (1)$$

where Re is the third resistor 270 and Rg is the first gate resistor 265.

As illustrated in equation (1), a reduction in the value of device Ri1 reduces the gate voltage $V_{ge}$ of switch Q1, which in turn, will increase the collector-to-emitter saturation voltage $V_{ce}$(sat) of switch Q1 which ultimately will reduce the current I1 through switch Q1. The reduction in I1 will also increase the current I2 through switch Q2 provided that the input and output operating conditions remain the same.

The modulation sensitivity of the gate voltage $V_{ge}$ can be determined by selecting the appropriate NTC type resistor (s). It should be noted that a small temperature range of the NTC resistor, e.g., 80° C. to 110° C., is preferable for the practice of the present invention. For example, a typical 1 kΩ(at 25° C.) NTC chip resistor, manufactured by Katema, will have a resistance of 208Ω at 80° C., 163Ω at 90° C., 130Ω at 100° C. and 105Ω at 110° C. Using a 18V peak gate driver voltage and a first gate resistor 265 with a resistance value of 100Ω, the switch's Q1 gate voltage $V_{ge}$ will be about 12.2V at 80° C., 11.2V at 90° C., 10.2V at 100° C. and 9.2V at 110° C. Since a small variation of collector-to-emitter saturation voltage Vce(sat), e.g., 0.1V–0.2V, is sufficient to create a large current imbalance, a gate modulation of 1V per 10° C. difference is sensitive enough to adjust collector-to-emitter saturation voltage Vce(sat) by 0.1V.

From the foregoing, it should be apparent that the current sharing scheme disclosed by the present invention does not require any additional high power circuit components, such as snubber components, or changes in the converter power train. The present invention fully utilizes the physical properties of IGBT semiconductor devices with the help of low power NTC type resistors that can be integrated into the IGBT semiconductor devices without increasing the device package size or changing other preferred properties inherent in the IGBTs, such as ease of gate drive, superior conduction characteristics and peak current capability.

Figure 4:
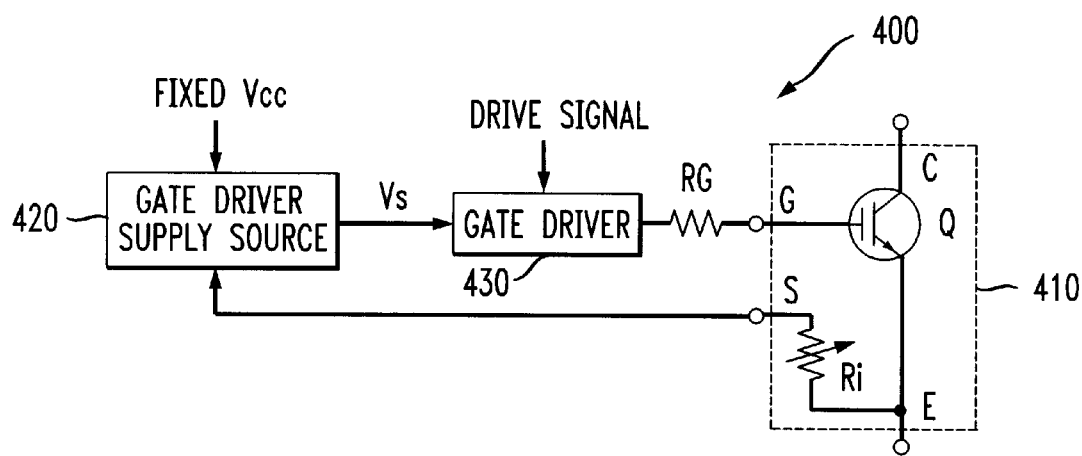
FIG. 4 illustrates an embodiment of a switch gate voltage modulation scheme using the principles of the present invention.

Turning now to FIG. 4, illustrated is an embodiment of a switch gate voltage modulation scheme 400 using the principles disclosed by the present invention. A switch assembly 410 is shown coupled to a gate driver supply source 420, such as an adjustable output voltage regulator or an output level adjustable step-down DC/DC converter, and a gate driver 430. The construction and operation of adjustable output voltage regulators, output level adjustable step-down DC/DC converters and gate drivers are well known in the art and will not hereinafter be described in detail.

The switch assembly 410 includes a switch Q with negative resistance-temperature coefficient characteristics, such as an IGBT, and a temperature-sensitive device Ri, such as an NTC resistor, that are thermally coupled to each other. In an advantageous embodiment, the device Ri is integrated into the switch Q body, i.e., device package, but that is not necessary to the broad scope of the present invention. The device Ri is used to sense the switch's Q temperature and the changes in the resistance of the device Ri is used to adjust the gate driver supply source's 420 peak voltage level. Consequently, the gate driver 430 output voltage peak level is controlled, i.e., modulated, using the switch's Q body temperature.

From the above, it should be apparent that the present invention provides for use in a switch-mode power converter including parallel-coupled first and second switches, the first switch having a temperature-dependent resistance, a circuit for, and method of, distributing current between the first and second switches. In one embodiment, the circuit includes a device having a temperature-dependent characteristic, in thermal communication with the first switch and electrically coupled to a gate of the first switch, that senses a temperature of the first switch, modulates an amplitude of a drive waveform applied to the gate based on the temperature and thereby redistributes the current.

For a better understanding of power electronics, power converter topologies, such as boost power converter, and control circuits, see: *Principles of Power Electronics,* by J. Kassakian and M. Schlecht, Addison-Wesley Publishing Company (1991), which is incorporated herein by reference.

Although the present invention and its advantages have been described in detail, those skilled in the art should understand that they can make various changes, substitutions and alterations herein without departing from the spirit and scope of the invention in its broadest form.

What is claimed is:

1. For use in a switch-mode power converter including parallel-coupled first and second switches, said first switch having a temperature-dependent resistance, a circuit for distributing current between said first and second switches, comprising:

a device having a temperature-dependent characteristic, in thermal communication with said first switch and electrically coupled to a gate of said first switch, that senses a temperature of said first switch, modulates an amplitude of a drive waveform applied to said gate based on said temperature and thereby redistributes said current.

2. The circuit as recited in claim 1 wherein said first switch is an insulated gate bipolar transistor (IGBT).

3. The circuit as recited in claim 1 wherein said device is a positive temperature coefficient (PTC) resistor and is further coupled to an output of a gate driver of said switch-mode power converter.

4. The circuit as recited in claim 1 wherein said device is a negative temperature coefficient (NTC) resistor and is further coupled to ground.

5. The circuit as recited in claim 1 wherein said switch-mode power converter further includes a pulse width modulation (PWM) controller.

6. The circuit as recited in claim 1 wherein said switch-mode power converter further includes an adjustable output voltage regulator.

7. The circuit as recited in claim 1 wherein said switch-mode power converter further includes an output level adjustable step-down DC/DC converter.

8. The circuit as recited in claim 1 wherein said device is integrated with said first switch into a single component.

9. For use in a switch-mode power converter including parallel-coupled first and second switches, said first switch having a temperature-dependent resistance, a method of distributing current between said first and second switches, comprising the steps of:

sensing a temperature of said first switch with a device having a temperature-dependent characteristic, in thermal communication with said first switch and electrically coupled to a gate of said first switch; and modulating an amplitude of a drive waveform applied to said gate based on said temperature thereby to redistribute said current.

10. The method as recited in claim 9 wherein said first switch is an insulated gate bipolar transistor (IGBT).

11. The method as recited in claim 9 wherein said device is a positive temperature coefficient (PTC) resistor and is further coupled to an output of a gate driver of said switch-mode power converter.

12. The method as recited in claim 9 wherein said device is a negative temperature coefficient (NTC) resistor and is further coupled to ground.

13. The method as recited in claim 9 wherein said drive waveform is a pulse width modulated (PWM) waveform.

14. The method as recited in claim 9 wherein said switch-mode power converter further includes an adjustable output voltage regulator.

15. The method as recited in claim 9 wherein said switch-mode power converter further includes an output level adjustable step-down DC/DC converter.

16. The method as recited in claim 9 wherein said device is integrated with said first switch into a single component.

17. A power supply, comprising:

a rectifier, couplable to a source of AC power, that provides rectified DC voltage;

a switch-mode power converter, coupled to said rectifier and including parallel-coupled first and second switches, said first switch having a temperature-dependent resistance and a circuit for distributing current between said first and second switches, including:

a device having a temperature-dependent characteristic, in thermal communication with said first switch and electrically coupled to a gate of said first switch, that senses a temperature of said first switch, modulates an amplitude of a drive waveform applied to said gate based on said temperature and thereby redistributes said current.

18. The power supply as recited in claim 17 wherein said first switch is an insulated gate bipolar transistor (IGBT).

19. The power supply as recited in claim 17 wherein said device is a positive temperature coefficient (PTC) resistor and is further coupled to an output of a gate driver of said switch-mode power converter.

20. The power supply as recited in claim 17 wherein said device is a negative temperature coefficient (NTC) resistor and is further coupled to ground.

21. The power supply as recited in claim 17 wherein said switch-mode power converter further includes a pulse width modulation (PWM) controller.

22. The power supply as recited in claim 17 wherein said switch-mode power converter further includes an adjustable output voltage regulator.

23. The power supply as recited in claim 17 wherein said switch-mode power converter further includes an output level adjustable step-down DC/DC converter.

24. The power supply as recited in claim 17 further comprising an electromagnetic interference (EMI) filter coupled between said source of AC power and said rectifier.

25. The power supply as recited in claim 17 wherein said rectifier is a three-phase rectifier.

26. The power supply as recited in claim 17 wherein said device is integrated with said first switch into a single component.

* * * * *